United States Patent
Huott et al.

(10) Patent No.: US 10,890,623 B1
(45) Date of Patent: Jan. 12, 2021

(54) POWER SAVING SCANNABLE LATCH OUTPUT DRIVER

(71) Applicant: International Business Machines Corporation, Armonk, NY (US)

(72) Inventors: William Huott, Holmes, NY (US); Yuen Chan, Poughkeepsie, NY (US); Pradip Patel, Poughkeepsie, NY (US); Daniel Rodko, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/559,776

(22) Filed: Sep. 4, 2019

(51) Int. Cl.
*G01R 31/28* (2006.01)
*G01R 31/3185* (2006.01)
*H03K 19/00* (2006.01)

(52) U.S. Cl.
CPC .............. *G01R 31/318541* (2013.01); *G01R 31/31855* (2013.01); *G01R 31/318572* (2013.01); *G01R 31/318575* (2013.01); *H03K 19/0016* (2013.01)

(58) Field of Classification Search
None
See application file for complete search history.

(56) References Cited

U.S. PATENT DOCUMENTS

| | | | | |
|---|---|---|---|---|
| 5,920,575 A | * | 7/1999 | Gregor | G01R 31/318541 714/726 |
| 6,606,720 B1 | * | 8/2003 | Naffziger | G01R 31/318541 714/726 |
| 8,314,643 B2 | | 11/2012 | Hamdan et al. | |
| 8,643,421 B1 | * | 2/2014 | Aipperspach | H03K 3/356156 327/202 |
| 2004/0105300 A1 | * | 6/2004 | Chuang | G11C 11/412 365/154 |
| 2004/0119502 A1 | | 6/2004 | Chandar et al. | |
| 2004/0221211 A1 | * | 11/2004 | Chen | H03K 19/00384 714/721 |
| 2006/0041802 A1 | * | 2/2006 | Grise | G01R 31/318555 714/724 |
| 2006/0123305 A1 | | 6/2006 | Linam et al. | |
| 2006/0156116 A1 | * | 7/2006 | Allen | G01R 31/318575 714/726 |
| 2014/0208176 A1 | | 7/2014 | Parikh et al. | |

OTHER PUBLICATIONS

Transmittal Form PTO/SB/21 signed Mar. 16, 2020.

\* cited by examiner

*Primary Examiner* — Mujtaba M Chaudry
(74) *Attorney, Agent, or Firm* — Cantor Colburn LLP; William Kinnaman

(57) ABSTRACT

Techniques for a power saving scannable latch output driver in an integrated circuit (IC) are described herein. An aspect includes receiving, by a circuit comprising a scannable latch, a scan signal. Another aspect includes, based on the scan signal being enabled, turning on a scan output driver of the scannable latch, wherein a scan input of the scannable latch propagates through the scannable latch to a scan output based on the scan output driver being turned on. Another aspect includes, based on the scan signal being disabled, turning off the scan output driver, wherein the scan output driver comprises a first p-type field effect transistor (PFET) and a first n-type field effect transistor (NFET), wherein a gate of the first PFET and a gate of the first NFET are connected to an output of a latch of the scannable latch.

20 Claims, 11 Drawing Sheets

POWER SAVING SCANNABLE LATCH OUTPUT DRIVER

BACKGROUND

The present invention generally relates to integrated circuits (ICs), and more specifically, to a power saving scannable latch output driver for an IC.

Scan testing may be used to test the functionality of sequential logic circuits within ICs. In a scan testing approach, some or all of the storage elements of an IC may be modified to include scan inputs and outputs. In addition, the scan inputs and outputs of the storage elements may be connected together in series to form a shift register, i.e., a scan chain. During a scan testing mode, the scan inputs may be capable of being selected, and the scan chain may be used to apply predetermined input signals to a set of combinational logic in the IC.

During a scan operation, scan data may be shifted into each of the storage elements. The output signals produced by the storage elements may then applied to the combinational logic, and signals produced by the combinational logic may be captured by the storage elements. The captured signals produced by the combinational logic may be subsequently shifted out of the storage elements of the IC and compared to expected values to determine if the combinational logic had performed a desired logic function. Latches may be modified for the purpose of scan testing because latches have relatively simple storage structures capable of transferring signals from inputs to outputs. There are many ways to make a latch scannable for the purpose of scan testing.

SUMMARY

Embodiments of the present invention are directed to a power saving scannable latch output driver. A non-limiting example computer-implemented method includes receiving, by a circuit comprising a scannable latch, a scan signal. The method also includes, based on the scan signal being enabled, turning on a scan output driver of the scannable latch, wherein a scan input of the scannable latch propagates through the scannable latch to a scan output based on the scan output driver being turned on. The method also includes, based on the scan signal being disabled, turning off the scan output driver, wherein the scan output driver comprises a first p-type field effect transistor (PFET) and a first n-type field effect transistor (NFET), wherein a gate of the first PFET and a gate of the first NFET are connected to an output of a latch of the scannable latch.

Other embodiments of the present invention implement features of the above-described method in systems and apparatuses.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

DETAILED DESCRIPTION

One or more embodiments of the present invention provide a power saving scannable latch output driver. Due to the additional circuit elements that may be required to make a latch scannable, a scannable latch may cover more chip area, and consume more power, than a non-scannable latch. A scannable latch may operate in a functional mode, in which a data input signal is propagated through the scannable latch to a data output, and a scan mode, in which a scan input signal is propagated through the scannable latch to a scan output of the scannable latch via a scan output driver. In order to reduce the power consumed by a scannable latch, the scan output driver of a scannable latch may be configured to turn off while the scannable latch is operating in the functional mode. The scan output driver may be turned off by the disabling of a scan signal, which may be a scan clock signal or a scan enable signal in various embodiments, of the scannable latch in the functional mode, and may be turned on by enabling the scan signal in the scan mode.

Figure 1A:
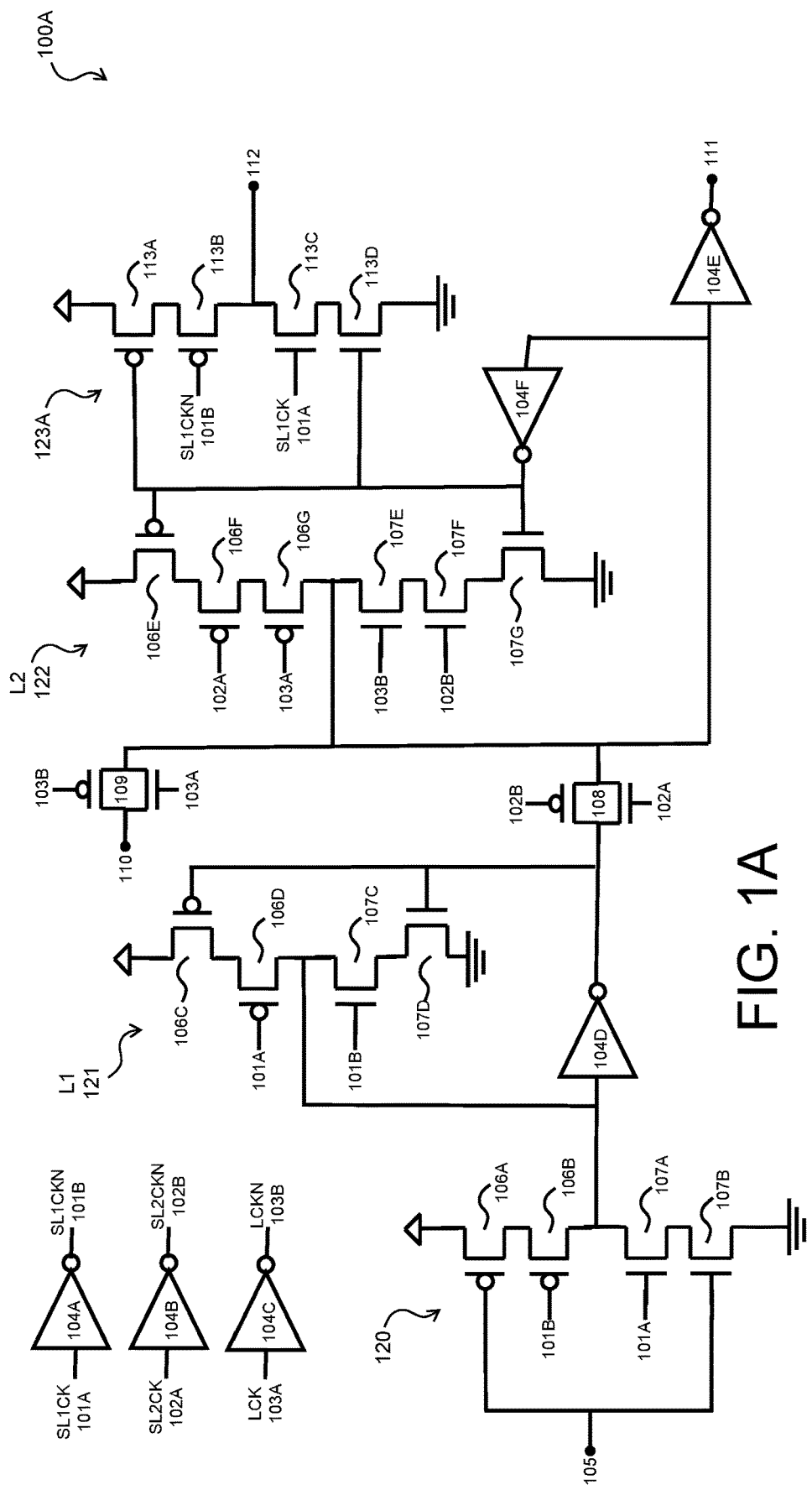
FIGS. 1A-1F are block diagrams of components of circuits for a power saving scannable latch output driver in accordance with one or more embodiments of the present invention.

Turning now to FIG. 1A, circuit 100A that includes a power saving scannable latch output driver is generally shown in accordance with one or more embodiments of the present invention. Circuit 100A is a pulsed scannable latch including a scan input circuitry 120, a latch including a primary (L1) latch 121 and a secondary (L2) latch 122, and a scan output driver 123A. The circuit 100A receives L1 scan clock signal (SL1CK) 101A, L2 scan clock signal (SL2CK) 102A, and functional clock signal (LCK) 103A. SL1CK 101A and SL2CK 102A may be orthogonal to each other in some embodiments. SL1CK 101A is provided to inverter 104A to generate inverted L1 scan clock signal (SL1CKN) 101B. SL2CK 101B is provided to inverter 104B to generate inverted L2 scan clock signal (SL2CKN) 102B. LCK 103A is provided to inverter 104C to generate inverted functional clock signal (LCKN) 103B.

The scan input circuitry 120 in circuit 100A is controlled by SL1CK 101A and SL1CKN 101B. The L1 latch 121 in circuit 100A is controlled by SL1CK 101A and SL1CKN 101B. The L2 latch 122 in circuit 100A is controlled by SL2CK 101A and SL2CKN 102B when the circuit 100A is in scan mode, and LCK 103A and LCKN 103B when the circuit 100A is in functional mode. The scan output driver 123A is controlled by SL1CK 101A and SL1CKN 101B. The circuit 100A may operate in a functional mode or a scan mode. In the functional mode, LCK 103A and LCKN 103B are enabled, and SL1CK 101A, SL1CK 101B, SL2CK 102A, and SL2CKN 102B are disabled. In the scan mode, LCK 103A and LCKN 103B are disabled, and SL1CK 101A, SL1CK 101B, SL2CK 102A, and SL2CKN 102B are enabled.

Scan input circuitry 120 includes an inverter comprising p-type field effect transistors (PFETs) 106A-B and n-type field effect transistors (NFETs) 107A-B connected between a rail voltage and ground. A scan input signal 105 is received by circuit 100A at scan input circuitry 120 at the gates of PFET 106A and NFET 107B. SL1CKN 101B is received at the gate of PFET 106B, and SL1CK 101A is received at the gate of NFET 107A. The scan input signal 105 may, based on SL1CK 101A and SL1CKN 101B, propagate to L1 latch 121. L1 latch 121 includes PFETs 106C-D, NFETs 107C-D, and inverter 104D. PFETs 106C-D and NFETs 107C-D are connected between the rail voltage and ground. SL1CK 101A is received at the gate of PFET 106D, and SL1CKN 101B is received at the gate of NFET 107C. An output of inverter 104D is received at the gates of PFET 106C and NFET 107D. An output of L1 latch 121 is received by transmission gate 108, which is controlled by SL2CK 102A and SL2CKN 102B. During the scan mode, the scan input signal 105 may propagate through scan input circuitry 120 and L1 latch 121 through transmission gate 108.

A data input signal 110 is received by circuit 100A at transmission gate 109. Transmission gate 109 is controlled by LCK 103A and LCKN 103B. When the circuit 100A is in the functional mode, the data input signal 110 may propagate via transmission gate 109 and L2 latch 122 to data output inverter 104E and data output 111. L2 latch 122 includes PFETs 106E-G and NFETs 107E-G connected between a rail voltage and ground, and inverter 104F. When the circuit 100A is in the scan mode, the scan input signal 105 may propagate from transmission gate 108 via L2 latch 122 and scan output driver 123A to scan output 112. Scan output driver 123A includes PFETs 113A-B and NFETs 113C-D. The gate of PFET 113B receives SL1CKN 101B, and the gate of NFET 113C receives SL1CK 101A. PFET 113B and NFET 113C act to turn off the scan output driver 123A, based on SL1CK 101A and SL1CKN 101B, when the circuit 100A is in the functional mode.

As shown in scan output driver 123A of FIG. 1A, the gate of PFET 113A is connected to an output of L2 latch 122, the source of PFET 113A is connected to the rail voltage, and the drain of PFET 113A is connected to the source of PFET 113B. The gate of PFET 113B is connected to SL1CKN 101B, the source of PFET 113B is connected to the drain of PFET 113A, and the drain of PFET 113B is connected to the scan output 112. The gate of NFET 113C is connected to SL1CK 101A, the source of NFET 113C is connected to the drain of NFET 113D, and the drain of NFET 113C is connected to the scan output 112. The gate of NFET 113D is connected to an output of L2 latch 122, the source of NFET 113D is connected to ground, and the drain of NFET 113D is connected to the source of NFET 113C.

It is to be understood that the block diagram of FIG. 1A is not intended to indicate that the circuit 100A is to include all of the components shown in FIG. 1A. Rather, the circuit 100A can include any appropriate fewer or additional components not illustrated in FIG. 1A (e.g., additional transistors, inputs, outputs, clock signals, inverters, transmission gates, circuit elements, memory components, embedded controllers, functional blocks, connections between functional blocks, modules, inputs, outputs, etc.). Further, the embodiments described herein with respect to circuit 100A may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments. Further, the scannable latch of circuit 100A of FIG. 1A is shown for illustrative purposes only; embodiments of a scan output driver such as scan output driver 123A as shown in FIG. 1A may be used in conjunction with a scannable latch having any appropriate configuration.

Figure 1B:
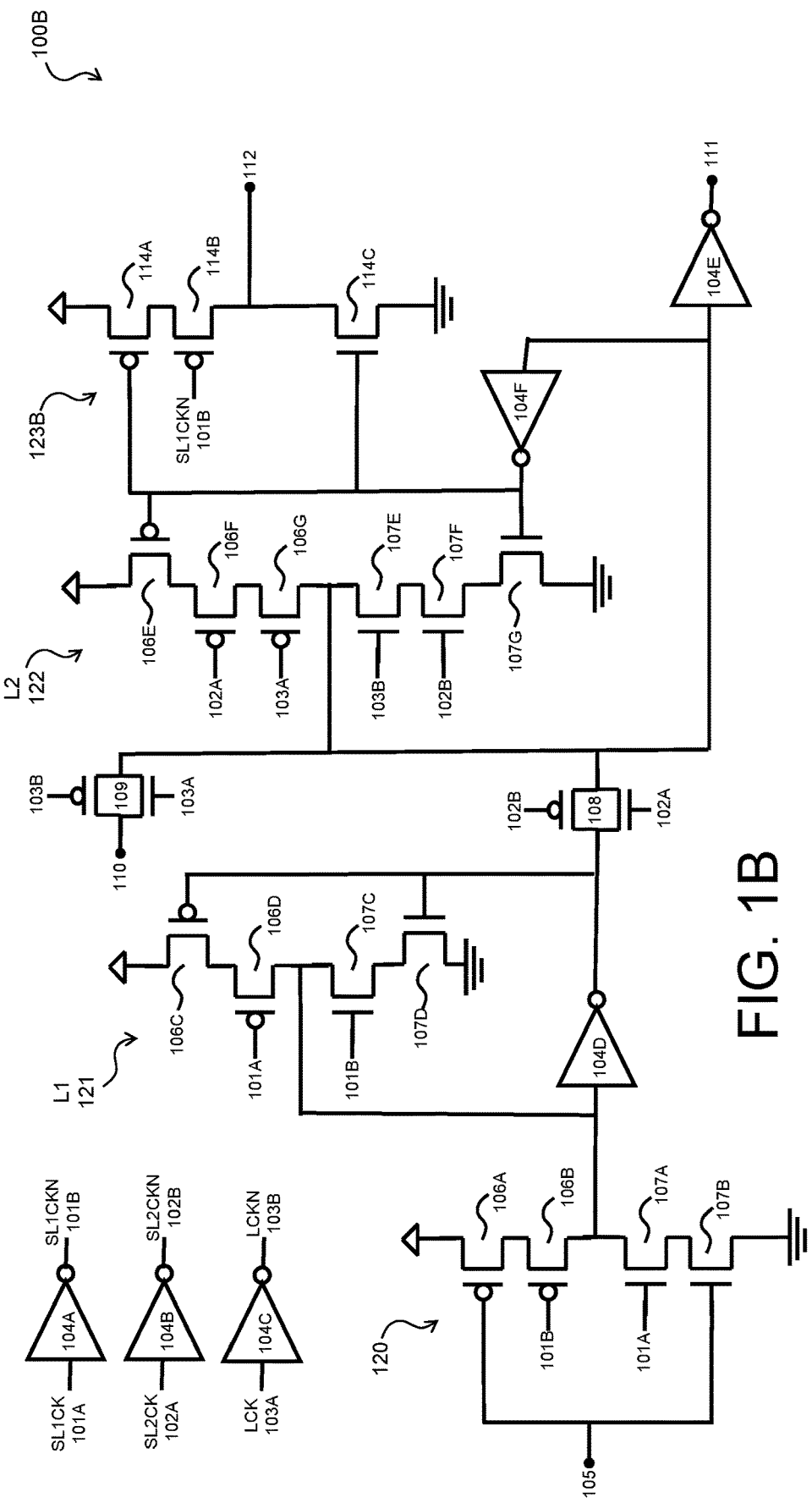

FIG. 1B shows a circuit 100B that includes a power saving scannable latch output driver in accordance with one or more embodiments of the present invention. Circuit 100B is a pulsed scannable latch including a scan input circuitry 120, L1 latch 121, and L2 latch 122, which are configured as described above with respect to circuit 100A of FIG. 1A. Circuit 100B also includes a scan output driver 123B. Circuit 100B includes clock signals SL1CK 101A, SL1CKN 101B, SL2CK 102A, SL2CKN 102B, LCK 103A, and LCKN 103B, which function as described above with respect to circuit 100A of FIG. 1A. Circuit 100B may function in a scan mode or a functional mode. The circuit 100B receives a data input signal 110, which, when the circuit 100B is in the functional mode, propagates via transmission gate 109, L2 latch 122, and data output inverter 104E to data output 111. The circuit 100B receives a scan input signal 105 at scan input circuitry 120, which, when the circuit 100B is in the scan mode, propagates via L1 latch 121, transmission gate 108, L2 latch 122, and scan output driver 123B to scan output 112. The scan output driver 123B of FIG. 1B includes PFETs 114A-B and NFET 114C. The gate of PFET 114B receives SL1CKN 101B. PFET 114B acts to turn off the scan output driver 123B, based on SL1CKN 101B, when the circuit 100B is in the functional mode.

As shown in scan output driver 123B of FIG. 1B, the gate of PFET 114A is connected to an output of L2 latch 122, the source of PFET 114A is connected to the rail voltage, and the drain of PFET 114A is connected to the source of PFET 114B. The gate of PFET 114B is connected to SL1CKN 101B, the source of PFET 114B is connected to the drain of PFET 114A, and the drain of PFET 114B is connected to the scan output 112. The gate of NFET 114C is connected to an output of L2 latch 122, the source of NFET 114C is connected to ground, and the drain of NFET 114C is connected to scan output 112.

It is to be understood that the block diagram of FIG. 1B is not intended to indicate that the circuit 100B is to include all of the components shown in FIG. 1B. Rather, the circuit 100B can include any appropriate fewer or additional components not illustrated in FIG. 1B (e.g., additional transistors, inputs, outputs, clock signals, inverters, transmission gates, circuit elements, memory components, embedded controllers, functional blocks, connections between functional blocks, modules, inputs, outputs, etc.). Further, the embodiments described herein with respect to circuit 100B may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments. Further, the scannable latch of circuit 100B of FIG. 1B is shown for illustrative purposes only; embodiments of a scan output driver such as scan output driver 123B as shown in FIG. 1B may be used in conjunction with a scannable latch having any appropriate configuration.

Figure 1C:
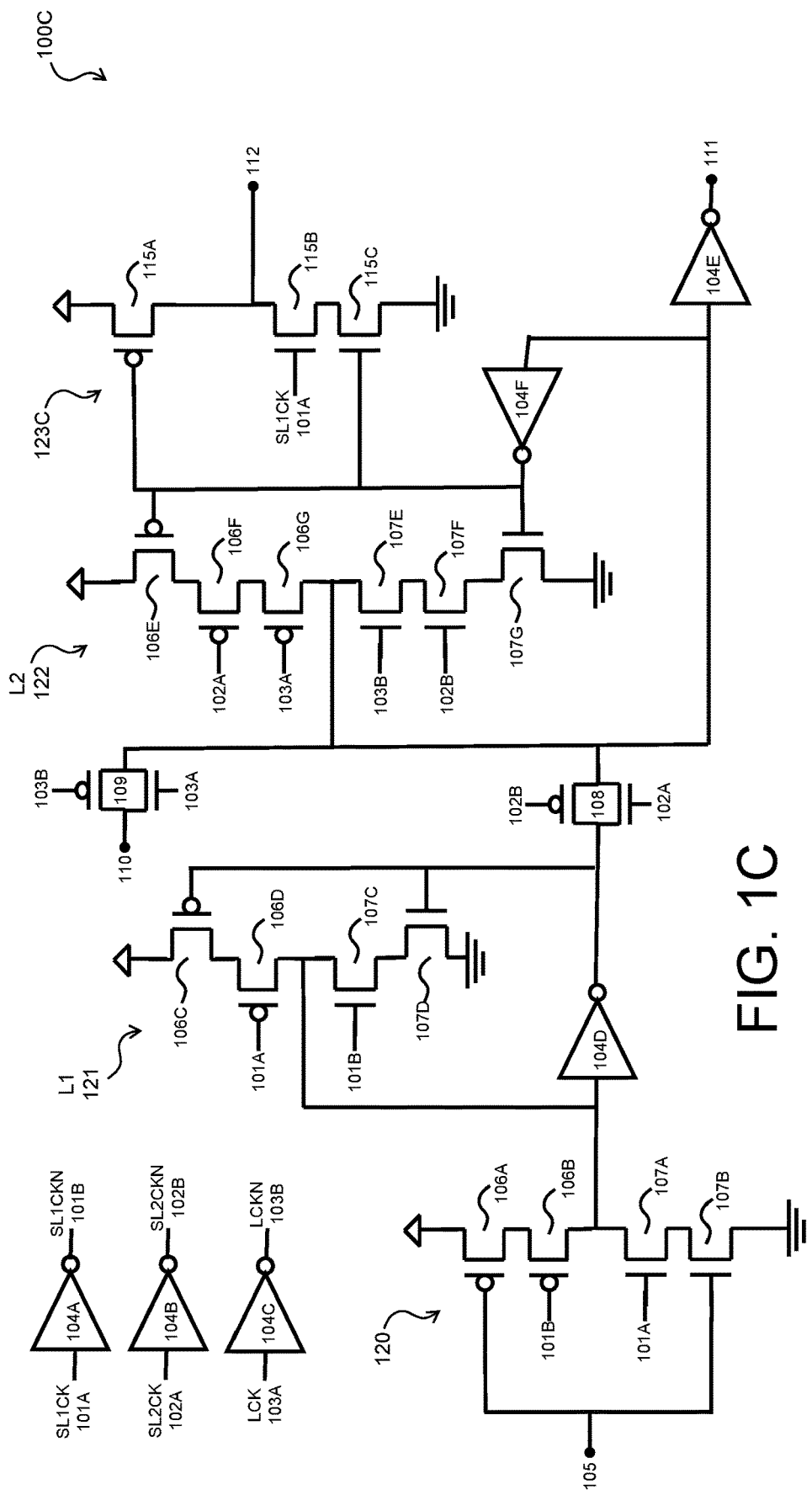

FIG. 1C shows a circuit 100C that includes a power saving scannable latch output driver in accordance with one or more embodiments of the present invention. Circuit 100C is a pulsed scannable latch including a scan input circuitry 120, L1 latch 121, and L2 latch 122, which are configured as described above with respect to circuit 100A of FIG. 1A. Circuit 100C also includes a scan output driver 123C. Circuit 100C includes clock signals SL1CK 101A, SL1CKN 101B, SL2CK 102A, SL2CKN 102B, LCK 103A, and LCKN 103B, which function as described above with respect to circuit 100A of FIG. 1A. Circuit 100C may function in a scan mode or a functional mode. The circuit 100C receives a data input signal 110, which, when the circuit 100C is in the functional mode, propagates via transmission gate 109, L2 latch 122, and data output inverter 104E to data output 111. The circuit 100C receives a scan input signal 105 at scan input circuitry 120, which, when the circuit 100C is in the scan mode, propagates via L1 latch 121, transmission gate 108, L2 latch 122, and scan output driver 123C to scan output 112. The scan output driver 123C of FIG. 1C includes PFET 115A and NFETs 115B-C. The gate of NFET 115B receives SL1CK 101A. NFET 115B acts to turn off the scan output driver 123C, based on SL1CK 101A, when the circuit 100C is in the functional mode.

As shown in scan output driver 123C of FIG. 1C, the gate of PFET 115A is connected to an output of L2 latch 122, the source of PFET 115A is connected to the rail voltage, and the drain of PFET 115A is connected to the scan output 112. The gate of NFET 115B is connected to SL1CK 101A, the source of NFET 115B is connected to the drain of NFET 115C, and the drain of NFET 115B is connected to the scan output 112. The gate of NFET 115C is connected to an output of L2 latch 122, the source of NFET 115C is connected to ground, and the drain of NFET 115C is connected to the source of NFET 115B.

It is to be understood that the block diagram of FIG. 1C is not intended to indicate that the circuit 100C is to include all of the components shown in FIG. 1C. Rather, the circuit 100C can include any appropriate fewer or additional components not illustrated in FIG. 1C (e.g., additional transistors, inputs, outputs, clock signals, inverters, transmission gates, circuit elements, memory components, embedded controllers, functional blocks, connections between functional blocks, modules, inputs, outputs, etc.). Further, the embodiments described herein with respect to circuit 100C may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments. Further, the scannable latch of circuit 100C of FIG. 1C is shown for illustrative purposes only; embodiments of a scan output driver such as scan output driver 123C as shown in FIG. 1C may be used in conjunction with a scannable latch having any appropriate configuration.

Figure 1D:
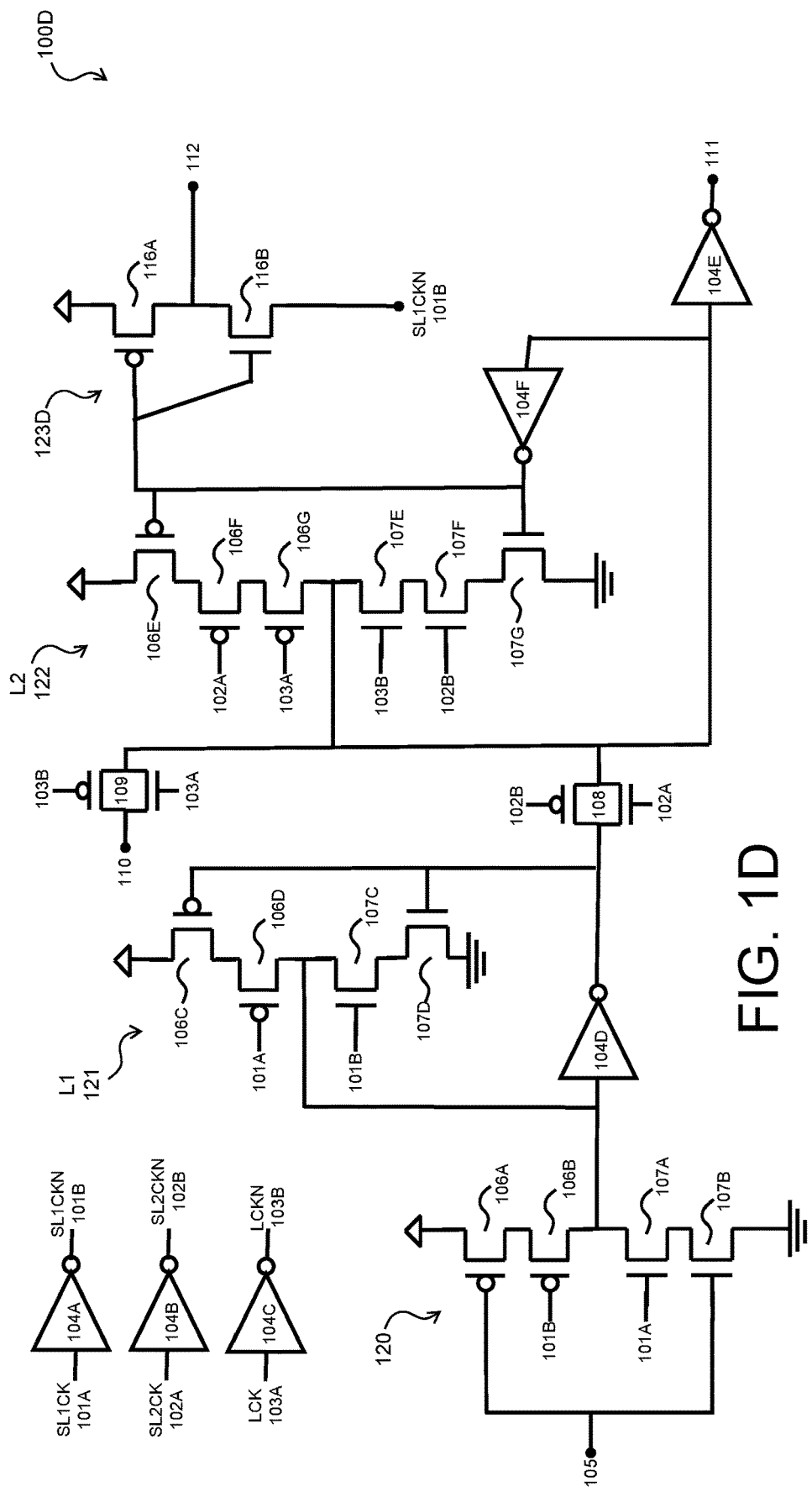

FIG. 1D shows a circuit 100D that includes a power saving scannable latch output driver in accordance with one or more embodiments of the present invention. Circuit 100D is a pulsed scannable latch comprising a scan input circuitry 120, L1 latch 121, and L2 latch 122, which are configured as described above with respect to circuit 100A of FIG. 1A. Circuit 100D also includes a scan output driver 123D. Circuit 100D includes clock signals SL1CK 101A, SL1CKN 101B, SL2CK 102A, SL2CKN 102B, LCK 103A, and LCKN 103B, which function as described above with respect to circuit 100A of FIG. 1A. Circuit 100D may function in a scan mode or a functional mode. The circuit 100D receives a data input signal 110, which, when the circuit 100D is in the functional mode, propagates via transmission gate 109, L2 latch 122, and data output inverter 104E to data output 111. The circuit 100D receives a scan input signal 105 at scan input circuitry 120, which, when the circuit 100D is in the scan mode, propagates via L1 latch 121, transmission gate 108, L2 latch 122, and scan output driver 123D to scan output 112. The scan output driver 123D of FIG. 1D includes PFET 116A and NFET 116B, which are controlled by L2 latch 122. PFET 116A and NFET 116B are connected between the rail voltage and SL1CKN 101B. SL1CKN 101B acts to turn off the scan output driver 123D when the circuit 100D is in the functional mode.

As shown in scan output driver 123D of FIG. 1D, the gate of PFET 116A is connected to an output of L2 latch 122, the source of PFET 116A is connected to the rail voltage, and the drain of PFET 116A is connected to the scan output 112. The gate of NFET 116B is connected to an output of L2 latch 122, the source of NFET 116B is connected to SL1CKN 101B, and the drain of NFET 116B is connected to scan output 112.

It is to be understood that the block diagram of FIG. 1D is not intended to indicate that the circuit 100D is to include all of the components shown in FIG. 1D. Rather, the circuit 100D can include any appropriate fewer or additional components not illustrated in FIG. 1D (e.g., additional transistors, inputs, outputs, clock signals, inverters, transmission gates, circuit elements, memory components, embedded controllers, functional blocks, connections between functional blocks, modules, inputs, outputs, etc.). Further, the embodiments described herein with respect to circuit 100B may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments. Further, the scannable latch of circuit 100D of FIG. 1D is shown for illustrative purposes only; embodiments of a scan output driver such as scan output driver 123D as shown in FIG. 1D may be used in conjunction with a scannable latch having any appropriate configuration.

Figure 1E:
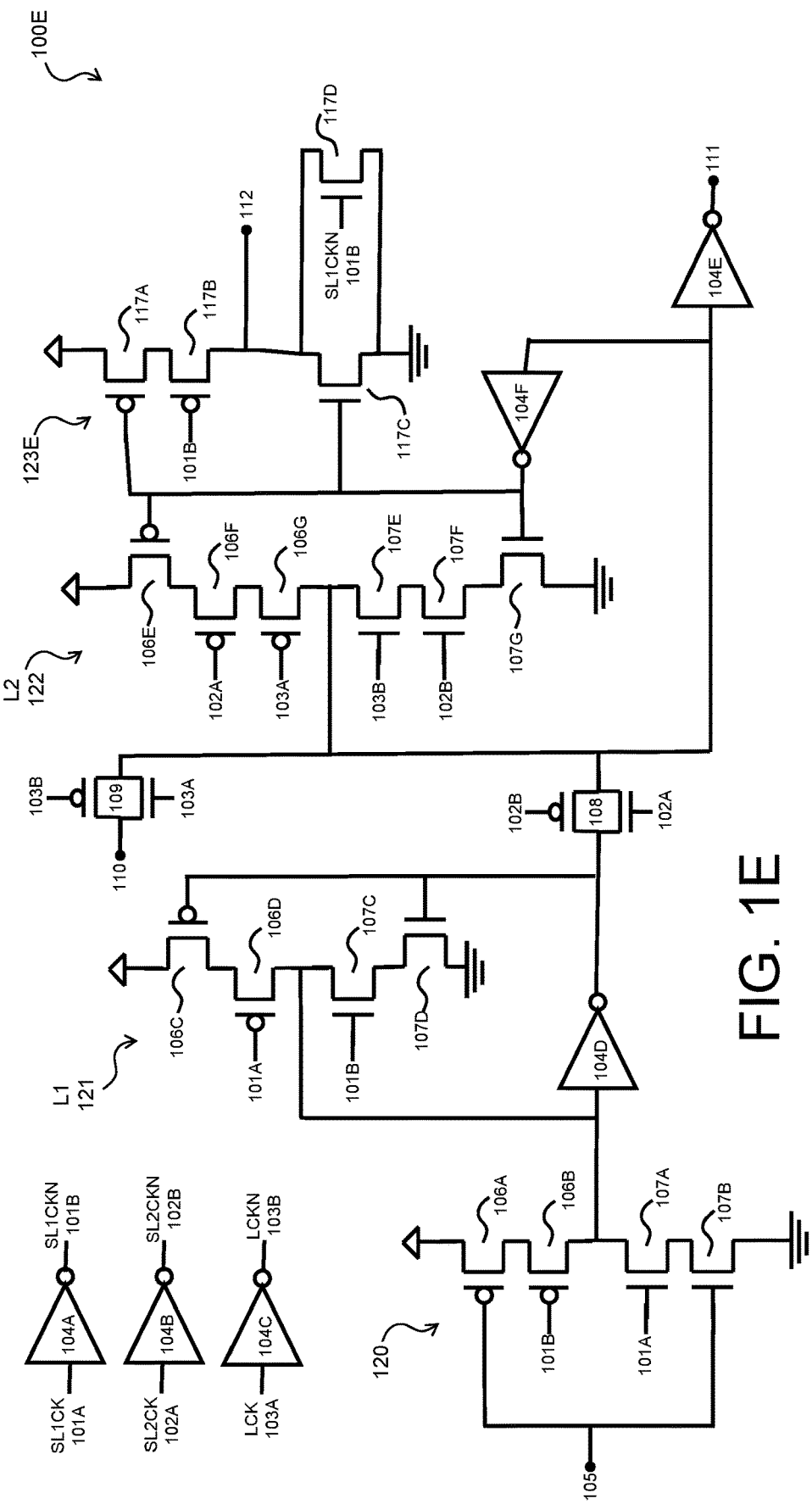

FIG. 1E shows a circuit 100E that includes a power saving scannable latch output driver in accordance with one or more embodiments of the present invention. Circuit 100E is a pulsed scannable latch comprising a scan input circuitry 120, L1 latch 121, and L2 latch 122, which are configured as described above with respect to circuit 100A of FIG. 1A. Circuit 100E also includes a scan output driver 123E. Circuit 100E includes clock signals SL1CK 101A, SL1CKN 101B, SL2CK 102A, SL2CKN 102B, LCK 103A, and LCKN 103B, which function as described above with respect to circuit 100A of FIG. 1A. Circuit 100E may function in a scan mode or a functional mode. The circuit 100E receives a data input signal 110, which, when the circuit 100E is in the functional mode, propagates via transmission gate 109, L2 latch 122, and data output inverter 104E to data output 111. The circuit 100E receives a scan input signal 105 at scan input circuitry 120, which, when the circuit 100E is in the scan mode, propagates via L1 latch 121, transmission gate 108, L2 latch 122, and scan output driver 123E to scan output 112. The scan output driver 123E of FIG. 1E includes PFETs 117A-B and NFETs 117C-D. The gate of PFET 117B is controlled by SL1CKN 101B. NFET 117D is connected in parallel with NFET 117C to form a NOR gate. The gate of NFET 117D is controlled by SL1CKN 101B. The PFET 117B, and the NOR gate comprising NFETs 117C-D, act to turn off the scan output driver 123E, based on SL1CK 101A and SL1CKN 101B, when the circuit 100E is in the functional mode.

As shown in scan output driver 123E of FIG. 1E, the gate of PFET 117A is connected to an output of L2 latch 122, the source of PFET 117A is connected to the rail voltage, and the drain of PFET 117A is connected to the source of PFET 117B. The gate of PFET 117B is connected to SL1CKN 101B, the source of PFET 117B is connected to the drain of PFET 117A, and the drain of PFET 117B is connected to the scan output 112. The gate of NFET 117C is connected to an output of L2 latch 122, the source of NFET 117C is connected to ground and to the source of NFET 117D, and the drain of NFET 117C is connected to scan output 112 and to the drain of NFET 117D. The gate of NFET 117D is connected to SL1CK 101A, the source of NFET 117D is connected to ground and to the source of NFET 117C, and the drain of NFET 117D is connected to the scan output 112 and to the drain of NFET 117C.

It is to be understood that the block diagram of FIG. 1E is not intended to indicate that the circuit 100E is to include all of the components shown in FIG. 1E. Rather, the circuit 100E can include any appropriate fewer or additional components not illustrated in FIG. 1E (e.g., additional transistors, inputs, outputs, clock signals, inverters, transmission gates, circuit elements, memory components, embedded controllers, functional blocks, connections between functional blocks, modules, inputs, outputs, etc.). Further, the embodiments described herein with respect to circuit 100B may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments. Further, the scannable latch of circuit 100E of FIG. 1E is shown for illustrative purposes only; embodiments of a scan output driver such as scan output driver 123E as shown in FIG. 1E may be used in conjunction with a scannable latch having any appropriate configuration.

Figure 1F:
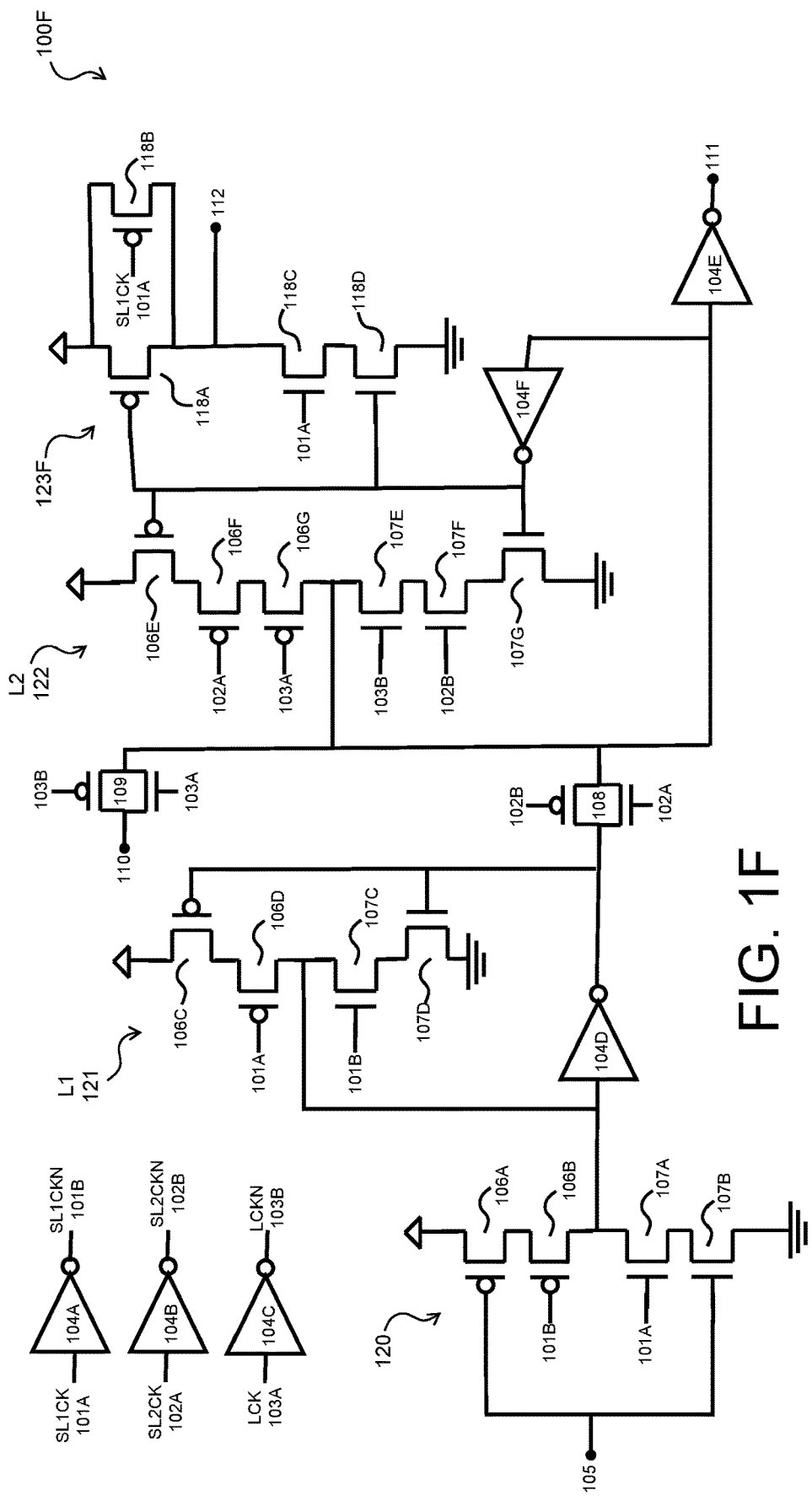

FIG. 1F shows a circuit 100F that includes a power saving scannable latch output driver in accordance with one or more embodiments of the present invention. Circuit 100F is a pulsed scannable latch including a scan input circuitry 120, L1 latch 121, and L2 latch 122, which are configured as described above with respect to circuit 100A of FIG. 1A. Circuit 100F also includes a scan output driver 123F. Circuit 100F includes clock signals SL1CK 101A, SL1CKN 101B, SL2CK 102A, SL2CKN 102B, LCK 103A, and LCKN 103B, which function as described above with respect to circuit 100A of FIG. 1A. Circuit 100F may function in a scan mode or a functional mode. The circuit 100F receives a data input signal 110, which, when the circuit 100F is in the functional mode, propagates via transmission gate 109, L2 latch 122, and data output inverter 104E to data output 111. The circuit 100F receives a scan input signal 105 at scan input circuitry 120, which, when the circuit 100F is in the scan mode, propagates via L1 latch 121, transmission gate 108, L2 latch 122, and scan output driver 123F to a scan output 112. The scan output driver 123F of FIG. 1F includes PFETs 118A-B and NFETs 118C-D. The gate of NFET 118C is controlled by SL1CK 101A. PFET 118B is connected in parallel with PFET 118A to form a NAND gate. The gate of PFET 118B is controlled by SL1CK 101A. The NFET 118C, and the NAND gate comprising PFETs 118A-B, act to turn off the scan output driver 123F, based on SL1CK 101A and SL1CKN 101B, when the circuit 100F is in the functional mode.

As shown in scan output driver 123F of FIG. 1F, the gate of PFET 118A is connected to an output of L2 latch 122, the source of PFET 118A is connected to the rail voltage and to the source of PFET 118B, and the drain of PFET 118A is connected to scan output 112 and to drain of PFET 118B. The gate of PFET 118B is connected to SL1CK 101A, the source of PFET 118B is connected to the rail voltage and to the source of PFET 118A, and the drain of PFET 118B is connected to the scan output 112 and to the drain of PFET 118A. The gate of NFET 118C is connected to SL1CK 101A, the source of NFET 118C is connected to the drain of NFET 118D, and the drain of NFET 118C is connected to the scan output 112. The gate of NFET 118D is connected to an output of L2 latch 122, the source of NFET 118D is connected to ground, and the drain of NFET 118D is connected to the source of NFET 118C.

It is to be understood that the block diagram of FIG. 1F is not intended to indicate that the circuit 100F is to include all of the components shown in FIG. 1F. Rather, the circuit 100F can include any appropriate fewer or additional components not illustrated in FIG. 1F (e.g., additional transistors, inputs, outputs, clock signals, inverters, transmission gates, circuit elements, memory components, embedded controllers, functional blocks, connections between functional blocks, modules, inputs, outputs, etc.). Further, the embodiments described herein with respect to circuit 100B may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments. Further, the scannable latch of circuit 100F of FIG. 1F is shown for illustrative purposes only; embodiments of a scan output driver such as scan output driver 123F as shown in FIG. 1F may be used in conjunction with a scannable latch having any appropriate configuration.

Figure 2A:
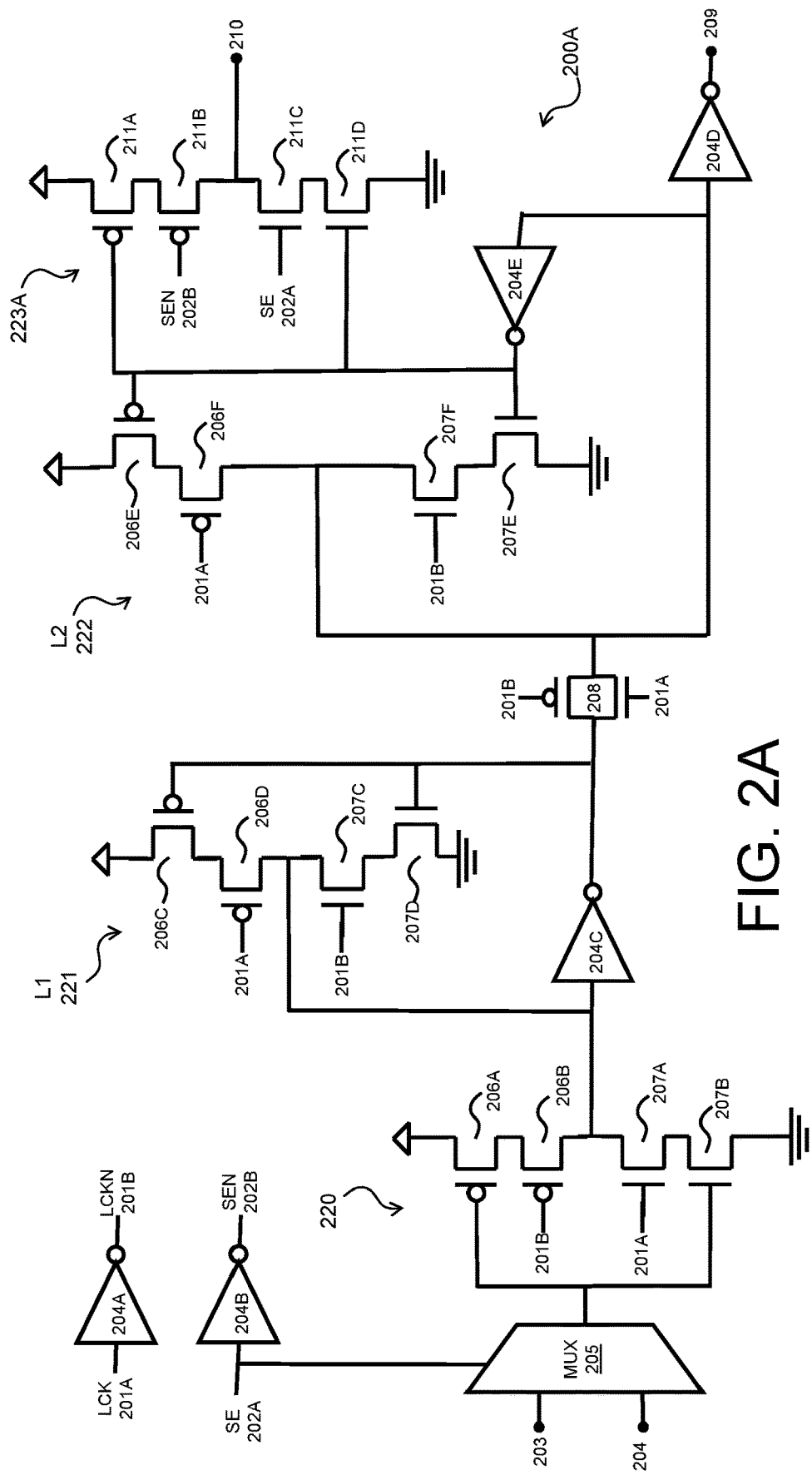
FIGS. 2A-2D are block diagrams of components of circuits for a power saving scannable latch output driver in accordance with one or more embodiments of the present invention.

Turning now to FIG. 2A, circuit 200A that includes a power saving scannable latch output driver is generally shown in accordance with one or more embodiments of the present invention. Circuit 200A is a multiplexer (MUX) scannable latch including input circuitry 220, L1 latch 221, L2 latch 222, and a scan output driver 223A. The circuit 200A receives functional clock signal (LCK) 201A and scan enable signal (SE) 202A. LCK 203A is provided to inverter 104A to generate inverted functional clock signal (LCKN) 201B. SE 202A may be a direct current (DC) signal, and is provided to inverter 104B to generate inverted scan enable signal (SEN) 202B. The input circuitry 220 in circuit 200A is controlled by SE 202A, LCK 201A, and LCKN 201B. The L1 latch 221 in circuit 200A is controlled by LCK 201A and LCKN 201B. The L2 latch 122 in circuit 100A is controlled by LCK 201A and LCKN 201B. The scan output driver 223A is controlled by SE 202A and SEN 202B. The circuit 200A may operate in a functional mode or a scan mode. In the functional mode, SE 202A is disabled (i.e., low), and SEN 202B is enabled (i.e., high). In the scan mode, SE 202A is enabled (i.e., high) and SEN 202B is disabled (i.e., low).

Input circuitry 220 includes MUX 205, and an input inverter comprising PFETs 206A-B and NFETs 207A-B connected between a rail voltage and ground. A scan input signal 203 and a data input signal 204 are received by MUX 205. MUX 205 is controlled by SE 202A to output one of scan input signal 203 (when the circuit 200A is in scan mode) or data input signal 204 (when the circuit 200A is in functional mode). The output of MUX 205 is provided to the input inverter comprising PFETs 206A-B and NFETs 207A-B, and propagates through the input inverter to L1 latch 221. In the input inverter, LCKN 201B is received at the gate of PFET 206B, and LCK 201A is received at the gate of NFET 207A. L1 latch 221 includes PFETs 206C-D, NFETs 207C-D, and inverter 204C. PFETs 206C-D and NFETs 207C-D are connected between the rail voltage and ground. LCK 201A is received at the gate of PFET 206D, and LCKN 201B is received at the gate of NFET 207C. An output of inverter 204C is received at the gates of PFET 206C and NFET 207D. An output of L1 latch 221 propagates through transmission gate 208, which is controlled by LCK 201A and LCKN 201B, to L2 latch 222. L2 latch 222 includes PFETs 206E-F and NFETs 207E-F connected between a rail voltage and ground, and inverter 204E. LCK 201A is received at the gate of PFET 206F, and LCKN 201B is received at the gate of NFET 207F. An output of the L2 latch 222 is received by data output inverter 204D, and also by scan output driver 223A.

When the circuit 200A is in functional mode (based on SE 202A being enabled), the data input signal 204 from MUX 205 propagates through the input inverter in input circuitry 220, L1 latch 221, transmission gate 208, and L2 latch 222 to data output inverter 204D and data output 209. When the circuit 200A is in scan mode (based on SE 202A being disabled), the scan input signal 203 from MUX 205 may propagate through the input inverter in input circuitry 220, L1 latch 221, transmission gate 208, and L2 latch 222 to scan output driver 223A and scan output 210. Scan output driver 223A includes PFETs 211A-B and NFETs 211C-D. The gate of PFET 211B receives SEN 202B, and the gate of NFET 211C receives SE 202A. PFET 211B and NFET 211C act to turn off the scan output driver 223A, based on SE 202A and SEN 202B, when the circuit 200A is in the functional mode.

As shown in scan output driver 223A of FIG. 2A, the gate of PFET 211A is connected to an output of L2 latch 222, the source of PFET 211A is connected to the rail voltage, and the drain of PFET 211A is connected to the source of PFET 211B. The gate of PFET 211B is connected to SEN 202B, the source of PFET 211B is connected to the drain of PFET 211A, and the drain of PFET 211B is connected to the scan output 210. The gate of NFET 211C is connected to SE 202A, the source of NFET 211C is connected to the drain of NFET 211D, and the drain of NFET 211C is connected to the scan output 210. The gate of NFET 211D is connected to an output of L2 latch 222, the source of NFET 211D is connected to ground, and the drain of NFET 211D is connected to the source of NFET 211C.

It is to be understood that the block diagram of FIG. 2A is not intended to indicate that the circuit 200A is to include all of the components shown in FIG. 2A. Rather, the circuit 200A can include any appropriate fewer or additional components not illustrated in FIG. 2A (e.g., additional transistors, inputs, outputs, clock signals, inverters, transmission gates, circuit elements, memory components, embedded controllers, functional blocks, connections between functional blocks, modules, inputs, outputs, etc.). Further, the embodiments described herein with respect to circuit 200A may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments. Further, the scannable latch of circuit 200A of FIG. 2A is shown for illustrative purposes only; embodiments of a scan output driver such as scan output driver 223A as shown in FIG. 2A may be used in conjunction with a scannable latch having any appropriate configuration.

Figure 2B:
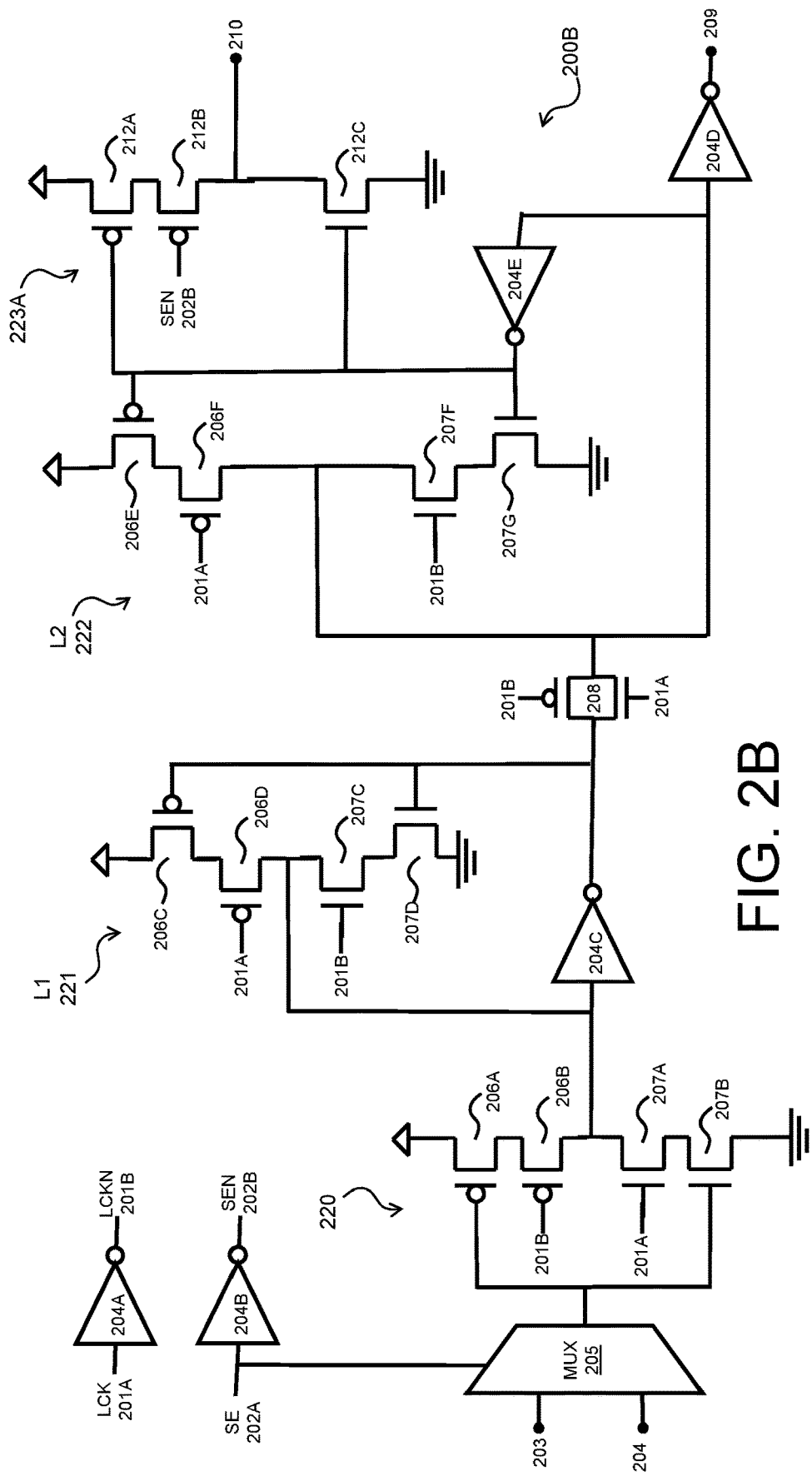

FIG. 2B shows a circuit 200B that includes a power saving scannable latch output driver in accordance with one or more embodiments of the present invention. Circuit 200B is a MUX scannable latch including input circuitry 220, L1 latch 221, and L2 latch 222, which are configured as described above with respect to circuit 200A of FIG. 2A. Circuit 200B also includes a scan output driver 223B. Circuit 200B includes clock signals LCK 201A and LCKN 201B, and DC signals SE 202A and SEN 202B, which function as described above with respect to circuit 200A of FIG. 2A. Circuit 200B may function in a scan mode or a functional mode. The circuit 200B receives a data input signal 204 at MUX 205, which, when the circuit 200B is in the functional mode, propagates via input circuitry 220, L1 latch 221, transmission gate 208, L2 latch 222, and data output inverter 204D to data output 209. The circuit 200B receives a scan input signal 203 at MUX 205, which, when the circuit 200B is in the scan mode, propagates via input circuitry 220, L1 latch 221, transmission gate 208, L2 latch 222, and scan output driver 223B to scan output 210. The scan output driver 223B of FIG. 2B includes PFETs 212A-B and NFET 212C. The gate of PFET 212B receives SEN 202B. PFET 212B acts to turn off the scan output driver 223B, based on SEN 202B, when the circuit 200B is in the functional mode.

As shown in scan output driver 223B of FIG. 2B, the gate of PFET 212A is connected to an output of L2 latch 222, the source of PFET 212A is connected to the rail voltage, and the drain of PFET 212A is connected to the source of PFET 212B. The gate of PFET 212B is connected to SEN 202B, the source of PFET 212B is connected to the drain of PFET 212A, and the drain of PFET 212B is connected to the scan output 210. The gate of NFET 212C is connected to an output of L2 latch 222, the source of NFET 212C is connected to ground, and the drain of NFET 212C is connected to scan output 210.

It is to be understood that the block diagram of FIG. 2B is not intended to indicate that the circuit 200B is to include all of the components shown in FIG. 2B. Rather, the circuit 200B can include any appropriate fewer or additional components not illustrated in FIG. 2B (e.g., additional transistors, inputs, outputs, clock signals, inverters, transmission gates, circuit elements, memory components, embedded controllers, functional blocks, connections between functional blocks, modules, inputs, outputs, etc.). Further, the embodiments described herein with respect to circuit 200B may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments. Further, the scannable latch of circuit 200B of FIG. 2B is shown for illustrative purposes only; embodiments of a scan output driver such as scan output driver 223B as shown in FIG. 2B may be used in conjunction with a scannable latch having any appropriate configuration.

Figure 2C:
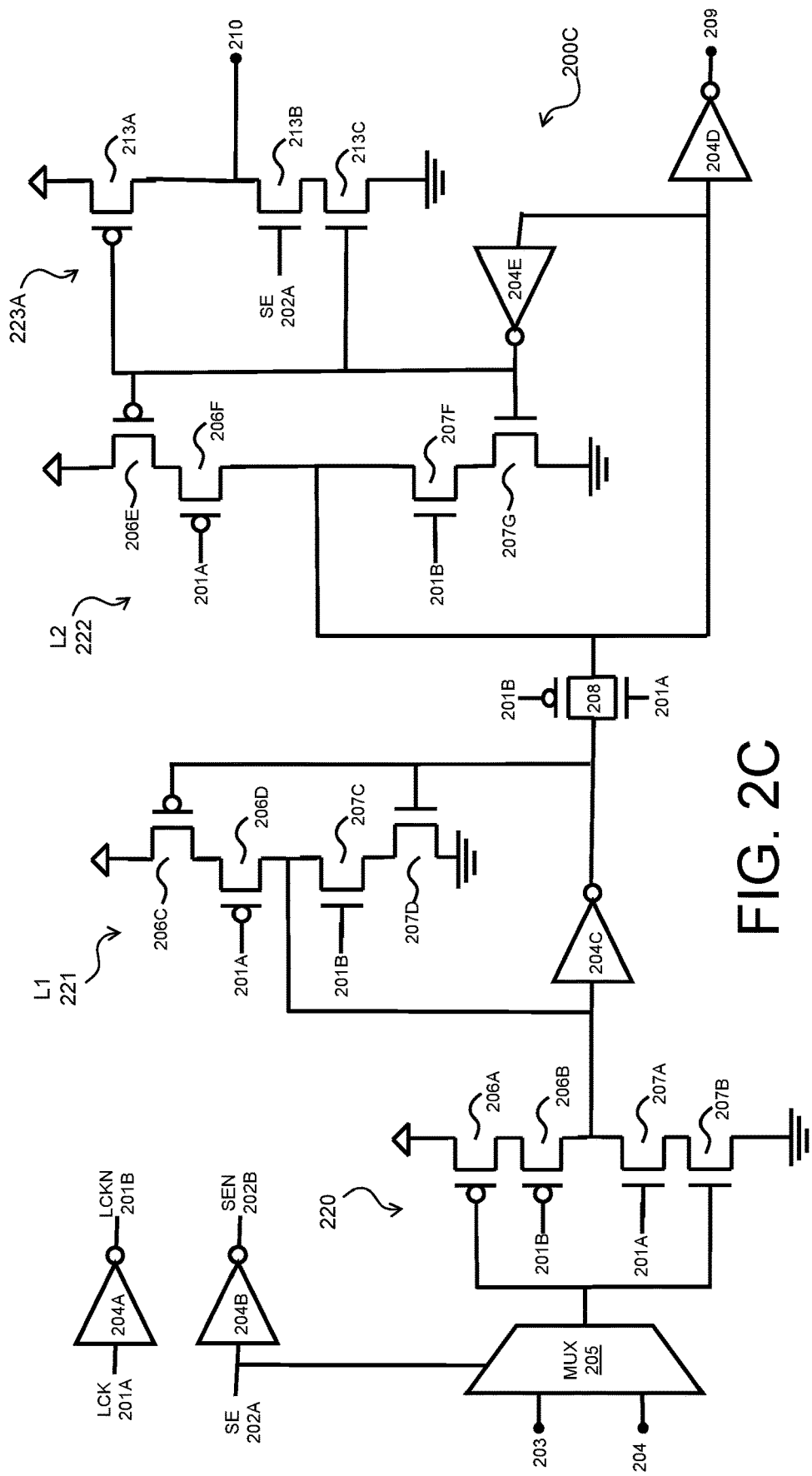

FIG. 2C shows a circuit 200C that includes a power saving scannable latch output driver in accordance with one or more embodiments of the present invention. Circuit 200C is a MUX scannable latch including input circuitry 220, L1 latch 221, and L2 latch 222, which are configured as described above with respect to circuit 200A of FIG. 2A. Circuit 200C also includes a scan output driver 223C. Circuit 200C includes clock signals LCK 201A and LCKN 201B, and DC signals SE 202A and SEN 202B, which function as described above with respect to circuit 200A of FIG. 2A. Circuit 200C may function in a scan mode or a functional mode. The circuit 200C receives a data input signal 204 at MUX 205, which, when the circuit 200C is in the functional mode, propagates via input circuitry 220, L1 latch 221, transmission gate 208, L2 latch 222, and data output inverter 204D to data output 209. The circuit 200C receives a scan input signal 203 at MUX 205, which, when the circuit 200B is in the scan mode, propagates via input circuitry 220, L1 latch 221, transmission gate 208, L2 latch 222, and scan output driver 223C to scan output 210. The scan output driver 223C of FIG. 2C includes PFET 213A and NFETs 213B-C. The gate of NFET 213B receives SE 202A. NFET 213B acts to turn off the scan output driver 223C, based on SE 202A, when the circuit 200C is in the functional mode.

As shown in scan output driver 223C of FIG. 2C, the gate of PFET 213A is connected to an output of L2 latch 222, the source of PFET 213A is connected to the rail voltage, and the drain of PFET 213A is connected to the scan output 210. The gate of NFET 213B is connected to SE 202A, the source of NFET 213B is connected to the drain of NFET 213C, and the drain of NFET 213B is connected to the scan output 210. The gate of NFET 213C is connected to an output of L2 latch 222, the source of NFET 213C is connected to ground, and the drain of NFET 213C is connected to the source of NFET 213B.

It is to be understood that the block diagram of FIG. 2C is not intended to indicate that the circuit 200C is to include all of the components shown in FIG. 2C. Rather, the circuit 200C can include any appropriate fewer or additional components not illustrated in FIG. 2C (e.g., additional transistors, inputs, outputs, clock signals, inverters, transmission gates, circuit elements, memory components, embedded controllers, functional blocks, connections between functional blocks, modules, inputs, outputs, etc.). Further, the embodiments described herein with respect to circuit 200C may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments. Further, the scannable latch of circuit 200C of FIG. 2C is shown for illustrative purposes only; embodiments of a scan output driver such as scan output driver 223C as shown in FIG. 2C may be used in conjunction with a scannable latch having any appropriate configuration.

Figure 2D:
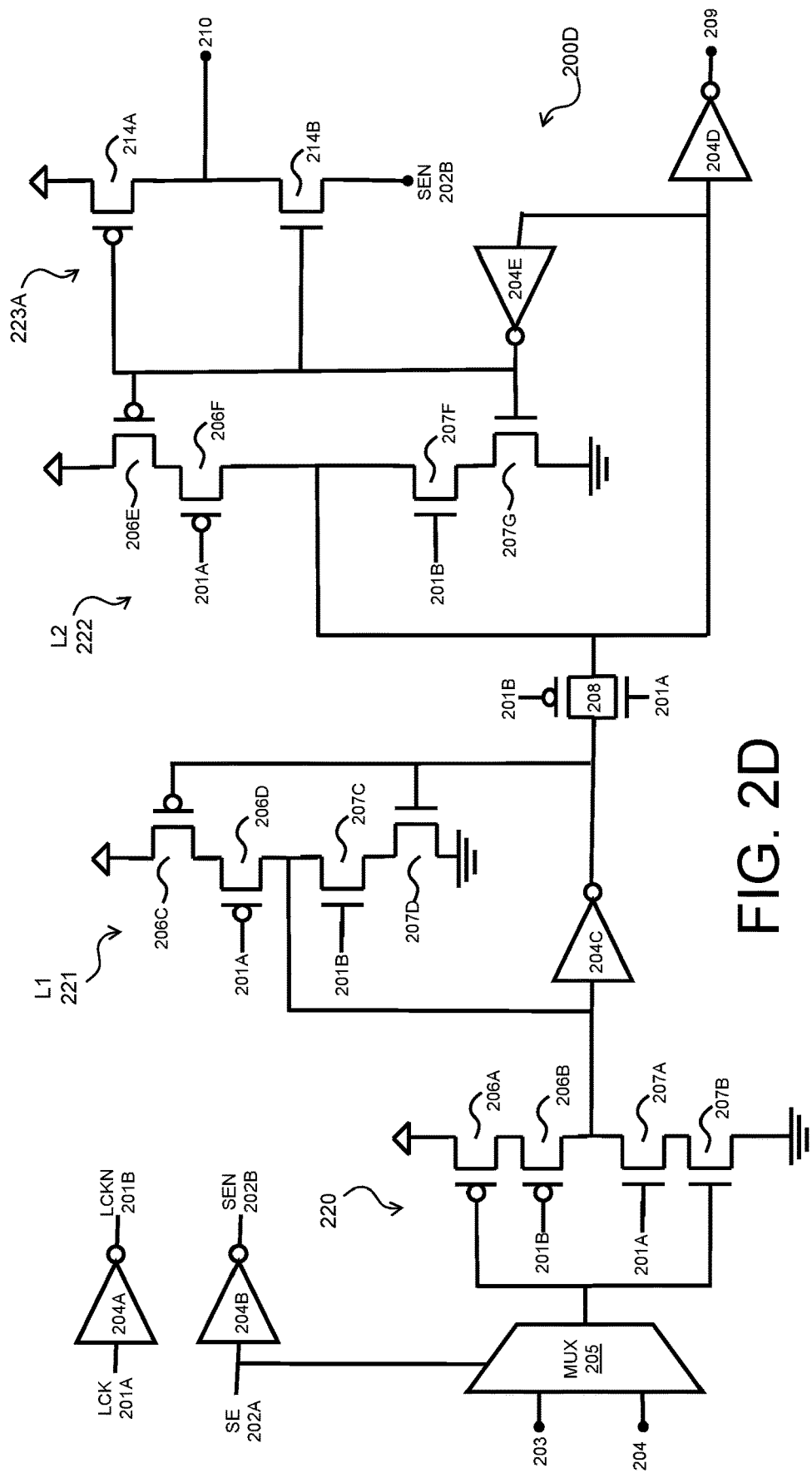

FIG. 2D shows a circuit 200D that includes a power saving scannable latch output driver in accordance with one or more embodiments of the present invention. Circuit 200D is a MUX scannable latch including input circuitry 220, L1 latch 221, and L2 latch 222, which are configured as described above with respect to circuit 200A of FIG. 2A. Circuit 200D also includes a scan output driver 223D. Circuit 200D includes clock signals LCK 201A and LCKN 201B, and DC signals SE 202A and SEN 202B, which function as described above with respect to circuit 200A of FIG. 2A. Circuit 200D may function in a scan mode or a functional mode. The circuit 200D receives a data input signal 204 at MUX 205, which, when the circuit 200D is in the functional mode, propagates via input circuitry 220, L1 latch 221, transmission gate 208, L2 latch 222, and data output inverter 204D to data output 209. The circuit 200D receives a scan input signal 203 at MUX 205, which, when the circuit 200D is in the scan mode, propagates via input circuitry 220, L1 latch 221, transmission gate 208, L2 latch 222, and scan output driver 223D to scan output 210. The scan output driver 223D of FIG. 1D includes PFET 214A and NFET 214B, which are controlled by L2 latch 222. PFET 214A and NFET 214B are connected between the rail voltage and SEN 202B. SEN 202B acts to turn off the scan output driver 223D when the circuit 200D is in the functional mode.

As shown in scan output driver 223D of FIG. 2D, the gate of PFET 214A is connected to an output of L2 latch 222, the source of PFET 214A is connected to the rail voltage, and the drain of PFET 214A is connected to the scan output 210. The gate of NFET 214B is connected to an output of L2 latch 222, the source of NFET 214B is connected to SEN 202B, and the drain of NFET 214B is connected to scan output 210.

It is to be understood that the block diagram of FIG. 2D is not intended to indicate that the circuit 200D is to include all of the components shown in FIG. 2D. Rather, the circuit 200D can include any appropriate fewer or additional components not illustrated in FIG. 2D (e.g., additional transistors, inputs, outputs, clock signals, inverters, transmission gates, circuit elements, memory components, embedded controllers, functional blocks, connections between functional blocks, modules, inputs, outputs, etc.). Further, the embodiments described herein with respect to circuit 200B may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments. Further, the scannable latch of circuit 200D of FIG. 2D is shown for illustrative purposes only; embodiments of a scan output driver such as scan output driver 223D as shown in FIG. 2D may be used in conjunction with a scannable latch having any appropriate configuration.

Figure 3:
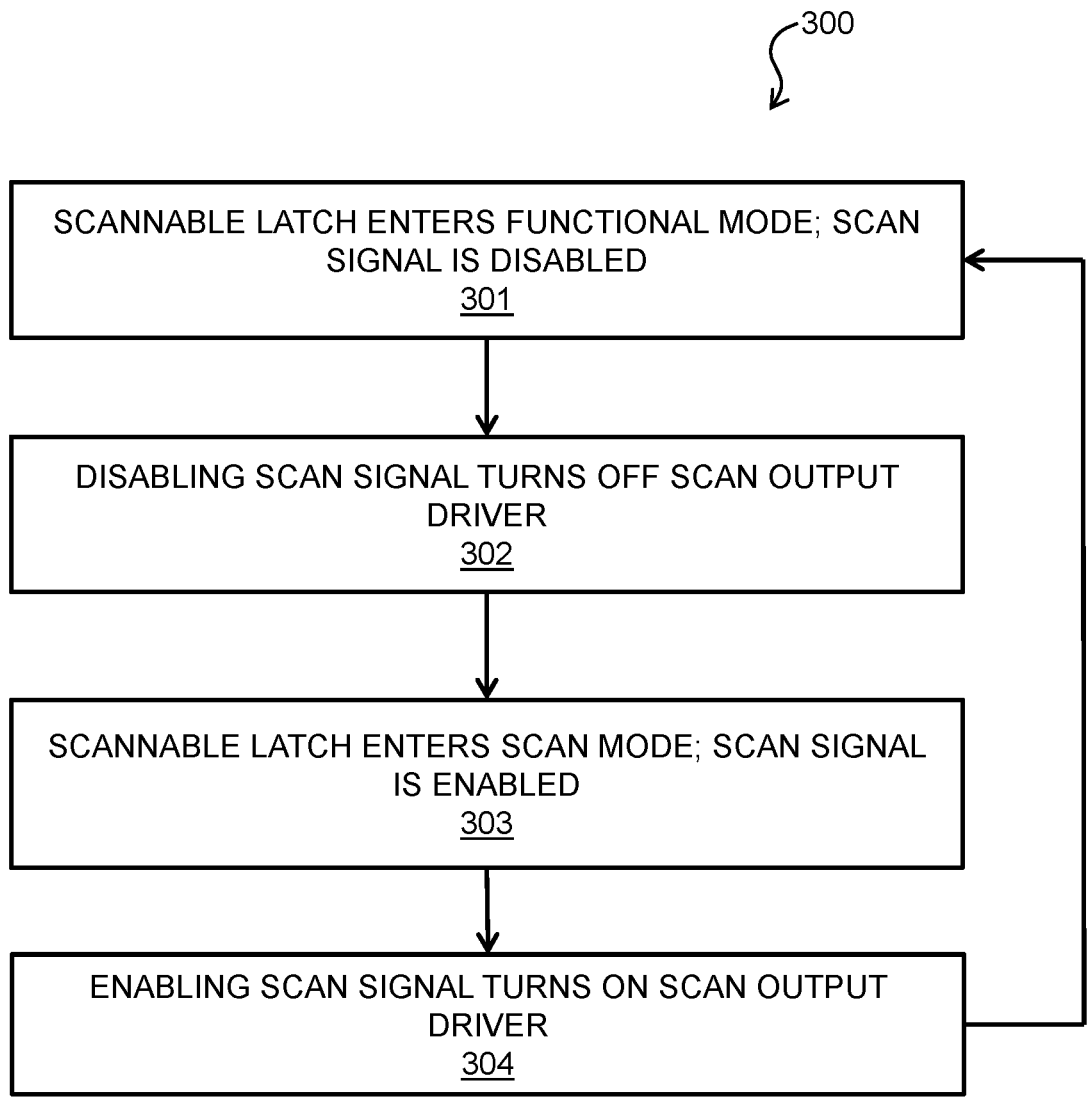
FIG. 3 is a flow diagram of a process for a power saving scannable latch output driver in accordance with one or more embodiments of the present invention.

FIG. 3 shows a process flow diagram of a method 300 for a power saving scannable latch output driver in accordance with one or more embodiments of the present invention. Embodiments of method 300 of FIG. 3 may be implemented in conjunction with any appropriate scannable latch including a scan output driver, including but not limited to the circuits 100A-F including scan output drivers 123A-F that are discussed above with respect to FIGS. 1A-F, and the circuits 200A-D including scan output drivers 223A-D discussed above with respect to FIGS. 2A-D. In block 301 of method 300, a scannable latch, which may include any of circuits 100A-F and circuits 200A-D, is in a functional mode. In the functional mode, in embodiments corresponding to FIGS. 1A-F, scan signals comprising L1 scan signal SL1CK 101A and L2 scan signal SL2CK 102A, and inverse L1 scan signal SL1CK 101B and inverse L2 scan signal SL2CK 102B, are disabled. In the functional mode, in embodiments corresponding to FIGS. 2A-D, a scan signal comprising SE 202A is disabled. In the functional mode, a data input signal (e.g., data input signal 110 of FIGS. 1A-F, or data input signal 204 of FIGS. 2A-D) propagates through the circuit to a data output (e.g. data output 111 of FIGS. 1A-F, or data output 209 of FIGS. 2A-D) based on a functional clock signal (e.g., LCK 103A and LCKN 103B of FIG. 1A-F, or LCK 201A and LCKN 201B of FIGS. 2A-D). In block 302 of method 300, in the functional mode, a scan output driver (which may include any of scan output drivers 123A-F and 223A-D that are discussed above with respect to FIGS. 1A-F and FIGS. 2A-D) is turned off based on the scan signal (e.g., SL1CK 101A and/or SL1CKN 101B in FIG. 1A-F, or SE 202A in FIGS. 2A-D) being disabled.

In block 303 of method 300, the scannable latch, which may include any of circuits 100A-F and circuits 200A-D, is in a scan mode. In the scan mode, in embodiments corresponding to FIGS. 1A-F, scan signals comprising L1 scan signal SL1CK 101A and L2 scan signal SL2CK 102A, and inverse L1 scan signal SL1CK 101B and inverse L2 scan signal SL2CK 102B, are enabled. In the scan mode, in embodiments corresponding to FIGS. 2A-D, a scan signal comprising SE 202A is enabled. In the scan mode, a scan signal (e.g., scan input signal 105 of FIGS. 1A-F, or scan input signal 203 of FIGS. 2A-D) propagates through the circuit to a scan output (e.g. scan output 112 of FIGS. 1A-F, or scan output 210 of FIGS. 2A-D). In block 304 of method 300, in the scan mode, the scan output driver (which may include any of scan output drivers 123A-F and 223A-D that are discussed above with respect to FIGS. 1A-F and FIGS. 2A-D) is turned on based on the scan signal (e.g., SL1CK 101A and/or SL1CKN 101B in FIG. 1A-F, or SE 202A in FIGS. 2A-D) being enabled. Blocks 301, 302, 303, and 304 of method 300 may be repeated throughout the operation of a scannable latch including a scan output driver as discussed above with respect to FIGS. 1A-F and FIGS. 2A-D.

The process flow diagram of FIG. 3 is not intended to indicate that the operations of the method 300 are to be executed in any particular order, or that all of the operations of the method 300 are to be included in every case. Additionally, the method 300 can include any suitable number of additional operations.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method comprising:
receiving, by a circuit comprising a scannable latch, a scan signal;
based on the scan signal being enabled, turning on a scan output driver of the scannable latch, wherein a scan input of the scannable latch propagates through the scannable latch to a scan output based on the scan output driver being turned on; and
based on the scan signal being disabled, turning off the scan output driver, wherein the scan output driver comprises a first p-type field effect transistor (PFET) and a first n-type field effect transistor (NFET), wherein a gate of the first PFET and a gate of the first NFET are connected to an output of a latch of the scannable latch.

2. The method of claim 1, wherein the scan output driver further comprises:
a second PFET, wherein a gate of the second PFET is connected to an inverse of the scan signal, a source of the second PFET is connected to the first PFET, and a drain of the second PFET is connected to the scan output of the scannable latch; and
a second NFET, wherein a gate of the second NFET is connected to the scan signal, a source of the second NFET is connected to the first NFET, and a drain of the second NFET is connected to the scan output of the scannable latch.

3. The method of claim 1, wherein the scan output driver further comprises:
a second PFET, wherein a gate of the second PFET is connected to an inverse of the scan signal, a source of the second PFET is connected to the first PFET, and a drain of the second PFET is connected to the scan output of the scannable latch.

4. The method of claim 1, wherein the scan output driver further comprises:
a second NFET, wherein a gate of the second NFET is connected to the scan signal, a source of the second NFET is connected to the first NFET, and a drain of the second NFET is connected to the scan output of the scannable latch.

5. The method of claim 1, wherein a drain of the first PFET is connected to the scan output; and
wherein a drain of the first NFET is connected to the scan output, and a source of the first NFET is connected to an inverse of the scan signal.

6. The method of claim 1, wherein the scan output driver further comprises:
a second PFET, wherein a gate of the second PFET is connected to an inverse of the scan signal, a source of the second PFET is connected to the first PFET, and a drain of the second PFET is connected to the scan output of the scannable latch; and
a second NFET, wherein the second NFET is connected in parallel with the first NFET, and wherein a gate of the second NFET is connected to an inverse of the scan signal.

7. The method of claim 1, wherein the scan output driver further comprises:
a second NFET, wherein a gate of the second NFET is connected to the scan signal, a source of the second NFET is connected to the first NFET, and a drain of the second NFET is connected to the scan output of the scannable latch; and
a second PFET, wherein the second PFET is connected in parallel with the first PFET, and wherein a gate of the second PFET is connected to the scan signal.

8. A system configured to:
receive, by a circuit comprising a scannable latch, a scan signal;
based on the scan signal being enabled, turn on a scan output driver of the scannable latch, wherein a scan input of the scannable latch propagates through the scannable latch to a scan output based on the scan output driver being turned on; and
based on the scan signal being disabled, turning off the scan output driver, wherein the scan output driver comprises a first p-type field effect transistor (PFET) and a first n-type field effect transistor (NFET), wherein a gate of the first PFET and a gate of the first NFET are connected to an output of a latch of the scannable latch.

9. The system of claim 8, wherein the scan output driver further comprises:
a second PFET, wherein a gate of the second PFET is connected to an inverse of the scan signal, a source of the second PFET is connected to the first PFET, and a drain of the second PFET is connected to the scan output of the scannable latch; and
a second NFET, wherein a gate of the second NFET is connected to the scan signal, a source of the second NFET is connected to the first NFET, and a drain of the second NFET is connected to the scan output of the scannable latch.

10. The system of claim 8, wherein the scan output driver further comprises:
a second PFET, wherein a gate of the second PFET is connected to an inverse of the scan signal, a source of the second PFET is connected to the first PFET, and a drain of the second PFET is connected to the scan output of the scannable latch.

11. The system of claim 8, wherein the scan output driver further comprises:
a second NFET, wherein a gate of the second NFET is connected to the scan signal, a source of the second NFET is connected to the first NFET, and a drain of the second NFET is connected to the scan output of the scannable latch.

12. The system of claim 8, wherein a drain of the first PFET is connected to the scan output; and
wherein a drain of the first NFET is connected to the scan output, and a source of the first NFET is connected to an inverse of the scan signal.

13. The system of claim 8, wherein the scan output driver further comprises:
a second PFET, wherein a gate of the second PFET is connected to an inverse of the scan signal, a source of the second PFET is connected to the first PFET, and a drain of the second PFET is connected to the scan output of the scannable latch; and a second NFET, wherein the second NFET is connected in parallel with the first NFET, and wherein a gate of the second NFET is connected to an inverse of the scan signal.

14. The system of claim 8, wherein the scan output driver further comprises:

a second NFET, wherein a gate of the second NFET is connected to the scan signal, a source of the second NFET is connected to the first NFET, and a drain of the second NFET is connected to the scan output of the scannable latch; and a second PFET, wherein the second PFET is connected in parallel with the first PFET, and wherein a gate of the second PFET is connected to the scan signal.

15. An apparatus, comprising logic configured to:

receive, by a circuit comprising a scannable latch, a scan signal;

based on the scan signal being enabled, turn on a scan output driver of the scannable latch, wherein a scan input of the scannable latch propagates through the scannable latch to a scan output based on the scan output driver being turned on; and based on the scan signal being disabled, turning off the scan output driver, wherein the scan output driver comprises a first p-type field effect transistor (PFET) and a first n-type field effect transistor (NFET), wherein a gate of the first PFET and a gate of the first NFET are connected to an output of a latch of the scannable latch.

16. The apparatus of claim 15, wherein the scan output driver further comprises:

a second PFET, wherein a gate of the second PFET is connected to an inverse of the scan signal, a source of the second PFET is connected to the first PFET, and a drain of the second PFET is connected to the scan output of the scannable latch.

17. The apparatus of claim 15, wherein the scan output driver further comprises:

a second NFET, wherein a gate of the second NFET is connected to the scan signal, a source of the second NFET is connected to the first NFET, and a drain of the second NFET is connected to the scan output of the scannable latch.

18. The apparatus of claim 15, wherein a drain of the first PFET is connected to the scan output; and wherein a drain of the first NFET is connected to the scan output, and a source of the first NFET is connected to an inverse of the scan signal.

19. The apparatus of claim 15, wherein the scan output driver further comprises:

a second PFET, wherein a gate of the second PFET is connected to an inverse of the scan signal, a source of the second PFET is connected to the first PFET, and a drain of the second PFET is connected to the scan output of the scannable latch; and a second NFET, wherein the second NFET is connected in parallel with the first NFET, and wherein a gate of the second NFET is connected to an inverse of the scan signal.

20. The apparatus of claim 15, wherein the scan output driver further comprises:

a second NFET, wherein a gate of the second NFET is connected to the scan signal, a source of the second NFET is connected to the first NFET, and a drain of the second NFET is connected to the scan output of the scannable latch; and a second PFET, wherein the second PFET is connected in parallel with the first PFET, and wherein a gate of the second PFET is connected to the scan signal.

* * * * *